(12) United States Patent
Tang et al.

(10) Patent No.: US 12,489,061 B2
(45) Date of Patent: Dec. 2, 2025

(54) SEMICONDUCTOR DEVICE WITH MULTIPLE DIES

(71) Applicant: TEXAS INSTRUMENTS INCORPORATED, Dallas, TX (US)

(72) Inventors: Yiqi Tang, Allen, TX (US); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 761 days.

(21) Appl. No.: 17/850,187

(22) Filed: Jun. 27, 2022

(65) Prior Publication Data

US 2023/0420380 A1    Dec. 28, 2023

(51) Int. Cl.
| | |
|---|---|
| *H01L 23/52* | (2006.01) |
| *H01L 21/48* | (2006.01) |
| *H01L 23/498* | (2006.01) |
| *H01L 23/538* | (2006.01) |
| *H01L 23/66* | (2006.01) |
| *H01L 25/065* | (2023.01) |
| H01L 23/00 | (2006.01) |

(52) U.S. Cl.
CPC ...... *H01L 23/5386* (2013.01); *H01L 21/4857* (2013.01); *H01L 21/486* (2013.01); *H01L 23/49822* (2013.01); *H01L 23/49838* (2013.01); *H01L 23/5383* (2013.01); *H01L 23/66* (2013.01); *H01L 25/0655* (2013.01); H01L 24/16 (2013.01); H01L 2223/6622 (2013.01); H01L 2223/6627 (2013.01); H01L 2223/6638 (2013.01); H01L 2224/16227 (2013.01); H01L 2224/16237 (2013.01); H01L 2924/1421 (2013.01); H01L 2924/14252 (2013.01); H01L 2924/1431 (2013.01); H01L 2924/30105 (2013.01); H01L 2924/30111 (2013.01)

(58) Field of Classification Search
None
See application file for complete search history.

(56) References Cited

U.S. PATENT DOCUMENTS

| | | | | |
|---|---|---|---|---|
| 6,111,756 | A * | 8/2000 | Moresco | H05K 7/023 |
| | | | | 174/250 |
| 6,265,763 | B1 | 7/2001 | Jao et al. | |
| 6,365,975 | B1 * | 4/2002 | DiStefano | H01L 23/52 |
| | | | | 257/E23.06 |
| 8,963,339 | B2 | 2/2015 | He et al. | |

(Continued)

*Primary Examiner* — Nicholas J Tobergte
(74) *Attorney, Agent, or Firm* — Ronald O. Neerings; Frank D. Cimino

(57) ABSTRACT

A semiconductor device includes a first die having ports and a second die having ports. The semiconductor device includes a multi-layer package substrate. The multi-layer package substrate includes a first layer patterned to include pads for the ports of the first die and the second die and a second layer patterned to provide vias between the pads for the ports of the first die and pads for the ports of the second die and a third layer of the multi-layer package substrate. The third layer is patterned to provide traces that couple the vias coupled to ports of the first die to vias coupled to ports of the second die to couple the first die to the second die, the traces of the third layer having a width. The multi-layer package substrate also includes a fourth layer underlying the third layer and a ground plane underlying the fourth layer.

14 Claims, 16 Drawing Sheets

(56) References Cited

U.S. PATENT DOCUMENTS

| | | |
|---|---|---|
| 11,282,824 B2 | 3/2022 | Klein |
| 11,329,025 B2 | 5/2022 | Arora et al. |
| 2004/0113250 A1* | 6/2004 | Khandros ............... H01L 24/50 257/680 |
| 2012/0161331 A1* | 6/2012 | Gonzalez ................ H01L 25/50 257/774 |
| 2014/0070380 A1* | 3/2014 | Chiu ................... H01L 23/5381 438/107 |
| 2015/0115405 A1* | 4/2015 | Wu ..................... H01L 25/0655 438/381 |
| 2019/0229058 A1* | 7/2019 | Qian ..................... H01L 23/528 |
| 2021/0405722 A1 | 12/2021 | Sadowski et al. |

* cited by examiner

SEMICONDUCTOR DEVICE WITH MULTIPLE DIES

TECHNICAL FIELD

This disclosure relates to semiconductor devices. More particularly, this disclosure relates to a semiconductor device that includes multiple dies.

BACKGROUND

A die, in the context of integrated circuits (ICs), is a small block of semiconducting material on which a given functional circuit is fabricated. In some examples, circuits are fabricated in batches on a single wafer of electronic-grade silicon (EGS) or other semiconductor through processes such as photolithography. The wafer is cut (diced) into many pieces, each containing one copy of the circuit. Each of these pieces is referred to as a die.

An IC package includes a die and an interconnect (e.g., a lead frame) that is employable to couple the die to pins of the IC package. The IC package also includes a plastic molding to encase the die and the interconnect. In some examples, an IC package includes multiple dies.

SUMMARY

A first example relates to a semiconductor device that includes a first die with ports and a second die with ports. The semiconductor device also includes a multi-layer package substrate. The multi-layer package substrate includes a first layer patterned to include pads for the ports of the first die and the second die and a second layer patterned to provide vias between the pads for the ports of the first die and pads for the ports of the second die and a third layer of the multi-layer package substrate. The third layer is patterned to provide traces that couple the vias coupled to ports of the first die to vias coupled to ports of the second die to couple the first die to the second die, the traces of the third layer of the multi-layer package substrate having a width. The multi-layer package substrate also includes a fourth layer underlying the third layer and a ground plane underlying the fourth layer. A distance between traces of the third layer and the ground plane defines a height of the traces, and the width and the height of the traces are selected to provide a predetermined characteristic impedance across the traces.

A second example relates to a method for forming a semiconductor device. The method includes forming a multi-layer package substrate with layers that includes dielectric distributed throughout the multi-layer package substrate. The layers of the multi-layer package substrate include transmission line structures and a ground plane underlying the transmission line structures. The transmission line structures include traces extending between vias of the multi-layer package substrate and through an interior layer of the multi-layer substrate that have a predetermined characteristic impedance. The method also includes mounting a first die and a second die on a surface of the multi-layer package substrate. The transmission line structures couple ports of the first die to ports of the second die.

DETAILED DESCRIPTION

This description relates to a semiconductor device with multiple dies, namely, a first die and a second die. The first die and the second die include ports. The first die and the second die are mounted on a surface of a multi-layer package substrate. The multilayer package substrate includes transmission line structures that have vias extending through an interior layer of the multi-layer package substrate, and between vias coupled to ports of the first die and the second die. The transmission line structures overlay a ground plane of the multi-layer package substrate.

The traces of the transmission line structures have dimensions (e.g., height and width) selected to provide a predetermined characteristic impedance. In some examples, the transmission line structures are single-ended signaling structures with a characteristic impedance of about 50 Ohms ($\Omega$). In other examples, the transmission line structures are paired to provide differential signaling structures with a characteristic impedance of about 100 Ohms ($\Omega$). The transmission line structures (formed of the vias and the traces) are configured to establish a communication channel between the first die and the second die.

In some examples, additional features, such as apertures cut in the ground plane are added to the multi-layer package substrate to tune (e.g., adjust) the characteristic impedance of the transmission line structures. Also, in some examples, segments of the traces of the transmission line structures have a reduced width to further adjust the characteristic impedance.

By providing the transmission line structures, the communication channel has a bandwidth of about 32 gigabits per second (Gbps) or more. Accordingly, the communication channel allows the first die and the second die of the semiconductor device to be mounted on the same surface of the multi-layer package substrate. Further, the communication channel obviates the need to integrate the circuitry of the first die and the second die thereby improving space efficiency of the semiconductor device.

Figure 1A:
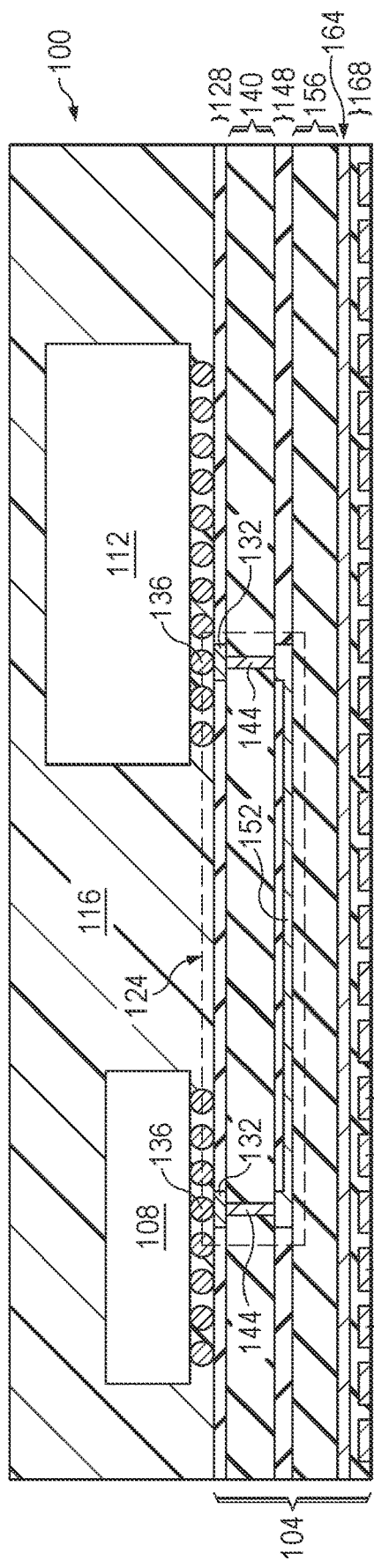
FIG. 1A illustrates a side view of an example of a semiconductor device with multiple dies mounted on a multi-layer substrate package.
Figure 1B:
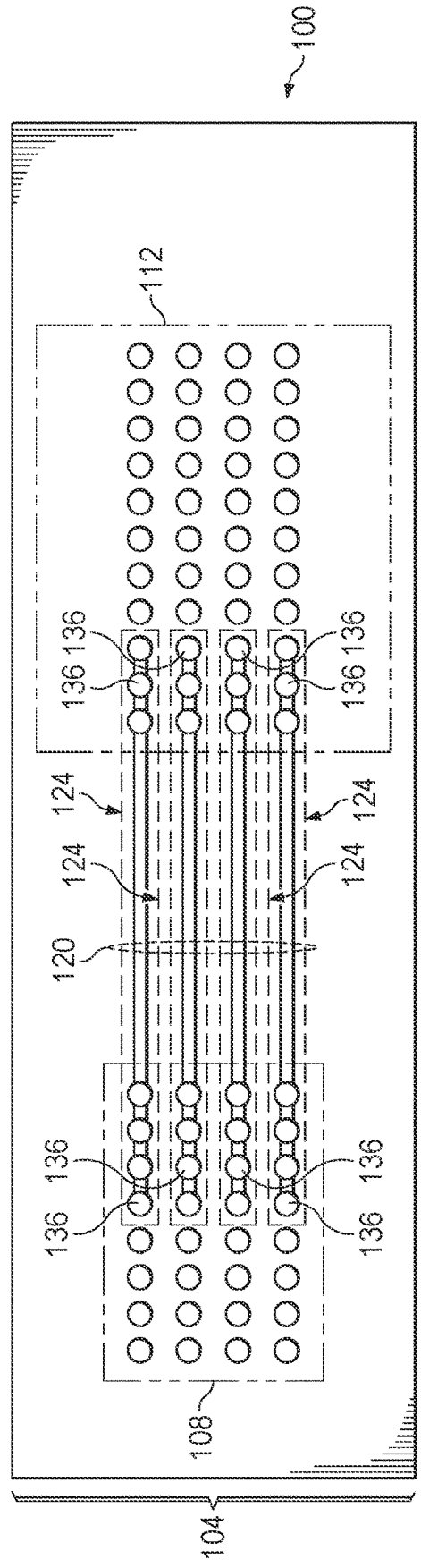
FIG. 1B illustrates an overhead view of an example of a semiconductor device with multiple dies mounted on a multi-layer substrate package.

FIGS. 1A and 1B illustrates a diagram of an example of a semiconductor device 100 mountable on a printed circuit board (PCB) or other circuit. More specifically, FIG. 1A illustrates a side view of the semiconductor device 100 and FIG. 1B illustrates an overhead view of the semiconductor device 100. The semiconductor device 100 can be implemented, for example, as an integrated circuit (IC) package. The semiconductor device 100 includes a multi-layer package substrate 104. The multi-layer package substrate 104 is an interconnect, alternatively referred to as a routable lead frame. In some examples, the multi-layer package substrate 104 is a multi-layer package substrate quad flat no-leads (QFN). Moreover, the semiconductor device 100 includes multiple dies, namely a first die 108 and a second die 112 that are mounted on a surface of the multi-layer package substrate 104 and encapsulated in a molding 116 (e.g., plastic; hidden from view in FIG. 1B). In the examples provided, two dies (the first die 108 and the second die 112) are illustrated, but in other examples, there are more dies mounted on the multi-layer package substrate 104. In the examples provided, the multi-layer package substrate 104 is employed as a type of connection assembly for connecting the first die 108 and the second die 112. In other examples, other types of connection assemblies are employable in place of the multi-layer package substrate 104.

The first die 108 and the second die 112 include modules for implementing electrical operations. In some examples, the first die 108 incorporates circuitry for implementing analog operations, such as power conversion, amplification, etc. Also, in some examples, the second die 112 incorporates circuitry for implementing digital operations, such as logic gates, timers, flip-flops, etc. In other examples, other arrangements are possible. The first die 108 and the second die 112 are configured to operate in concert.

The first die 108 and the second die 112 communicate through a communication channel 120 (data link). The communication channel 120 is formed with transmission line structures 124 that couple ports of the first die 108 and the second die 108. In some examples, there are four or more transmission line structures 124. The transmission line structures 124 are formed within the multi-layer package substrate 104. Stated differently, the traces 152 and the vias 144 forming the transmission line structures 124 are configured to establish the communication channel 120.

The multi-layer package substrate 104 includes a first layer 128 that underlies the first die 108 and the second die 112. The first layer 128 of the multi-layer package substrate 104 is formed with dielectric material that is patterned with a conductive material (e.g., copper or gold) to form pads 132 that are coupled to ports (e.g., input ports and output ports) of the first die 108 and the second die 112. More particularly, the first die 108 includes ports (e.g., input and output ports) that are coupled to the pads 132 through solder bumps 136.

The multi-layer package substrate 104 includes a second layer 140 that includes vias 144. The vias 144 are employable to provide electrical paths between the first layer 128 and a third layer 148 (or to another layer) of the multi-layer package substrate 104. The third layer 148 of the multi-layer package substrate 104 is patterned with traces 152. A fourth layer 156 of the multi-layer package substrate 104 underlies the third layer 148 of the multi-layer package substrate 104. A ground plane 164 (e.g., a layer of conductive material) underlies the fourth layer 156. Moreover, in some examples, a fifth layer 168 of the multi-layer package substrate 104 underlies the ground plane 164. Pads 172 (only some of which are labeled) are patterned in the fifth layer 168 to enable the semiconductor device 100 to be coupled to an external circuit.

The transmission line structures 124 include traces 152 of the third layer 148 of the multi-layer package substrate 104 that are coupled between two of the vias 144. As noted, the vias 144 are coupled to the pads 132 of the first layer 128, which in turn are coupled to solder bumps 136 (coupled to ports) of the first die 108 and the second die 112. In this manner, the transmission line structures 124 couple the ports of the first die 108 with the ports of the second die 112 to enable communication between the first die 108 and the second die 112.

As is illustrated in FIG. 1B, there are multiple transmission line structures 124 within the communication channel 120. Stated differently, the transmission line structures 124 operate in concert to provide the communication channel 120. In some examples, the transmission line structures 124 are single-ended signaling structures. In other examples, a pair of the transmission line structures 124 operate as a differential signaling structure. The dimensions of the traces 152 are selected to provide a predetermined characteristic impedance, $Z_0$.

Figure 2:
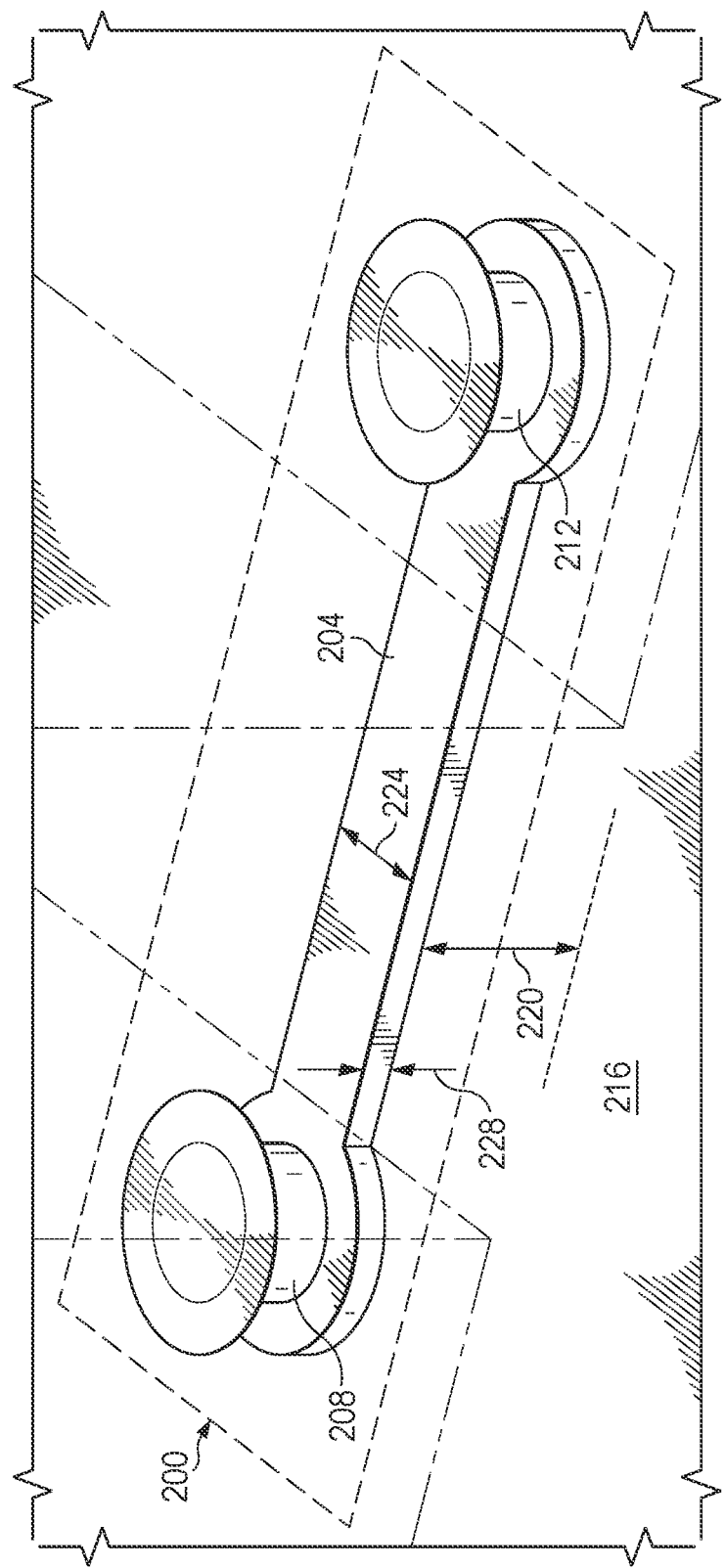
FIG. 2 illustrates an example of a transmission line structure that provides a single-ended signaling structure.

FIG. 2 illustrates a diagram of a transmission line structure 200 that is employable to implement one of the transmission line structures 124 of FIGS. 1A and 1B. The transmission line structure 200 is fabricated in a multi-layer package substrate, such as the multi-layer package substrate 104 of FIGS. 1A and 1B. The transmission line structure 200 is a single ended signaling structure. The transmission line structure 200 includes a trace 204 that extends between a first via 208 and a second via 212. The first via 208 is coupled to a port of a first die (e.g. the first die 108 of FIGS. 1A and 1B) an the second via 212 is coupled to a port of a second die (e.g., the second die 112 of FIGS. 1A and 1B). In this manner, the transmission line structure 200 provides a portion of a communication channel (e.g., the communication channel 120 of FIG. 1B) between the first die and the second die.

The trace 204 has dimensions that are selected to provide a predetermined characteristic impedance, $Z_0$ of about 50 Ohms ($\Omega$). Unless otherwise stated, in this description, 'about' preceding a value means +/−10 percent of the stated value. The trace 204 overlies a ground plane 216, such as the ground plane 164 of FIGS. 1A and 1B that defines a height 220 of the trace 204. The height 220 is alternatively referred to as a depth of the trace 204. The trace 204 also has a width 224 and a thickness 228. Equation 1 is employable to determine the characteristic impedance, $Z_0$ of the trace 204.

$$Z_0 = \begin{cases} \dfrac{60}{\sqrt{\epsilon_e}} \ln\left(\dfrac{8d}{W} + \dfrac{W}{4d}\right) & \text{for } \dfrac{W}{d} \leq 1 \\ \dfrac{120\pi}{\sqrt{\epsilon_e}\left[\dfrac{W}{d} + 1.393 + 0.667\ln\left(\dfrac{W}{d} + 1.444\right)\right]} & \text{for } \dfrac{W}{d} \geq 1 \end{cases}$$

Wherein:
$Z_0$ is the characteristic impedance of the trace 204;
$\epsilon_e$ is the effective dielectric constant for the multi-layer package substrate;
d is the height 220 (or depth) of the trace 204; and
W is the width 224 of the trace 204.

In at least one example, the height 220 of the trace 204 is about 45 micrometers (μm) and the width 224 is about 80 μm. Thus, in such examples, the trace 204 has a width to height ratio of about 1.77. That is, the width of the traces 204 is about 1.77 times greater than the height of the trace 204. Further, in some examples, the thickness 228 of the trace 204 is about 20 μm. In some examples, the effective dielectric constant, $\epsilon_e$ for a material such as a build up insulating film for the multi-layer package substrate is about 3.0-4.0 (e.g., about 3.5). In such an example, the trace 204 has a predetermined characteristic impedance, $Z_0$ of about 50Ω.

Figure 3:
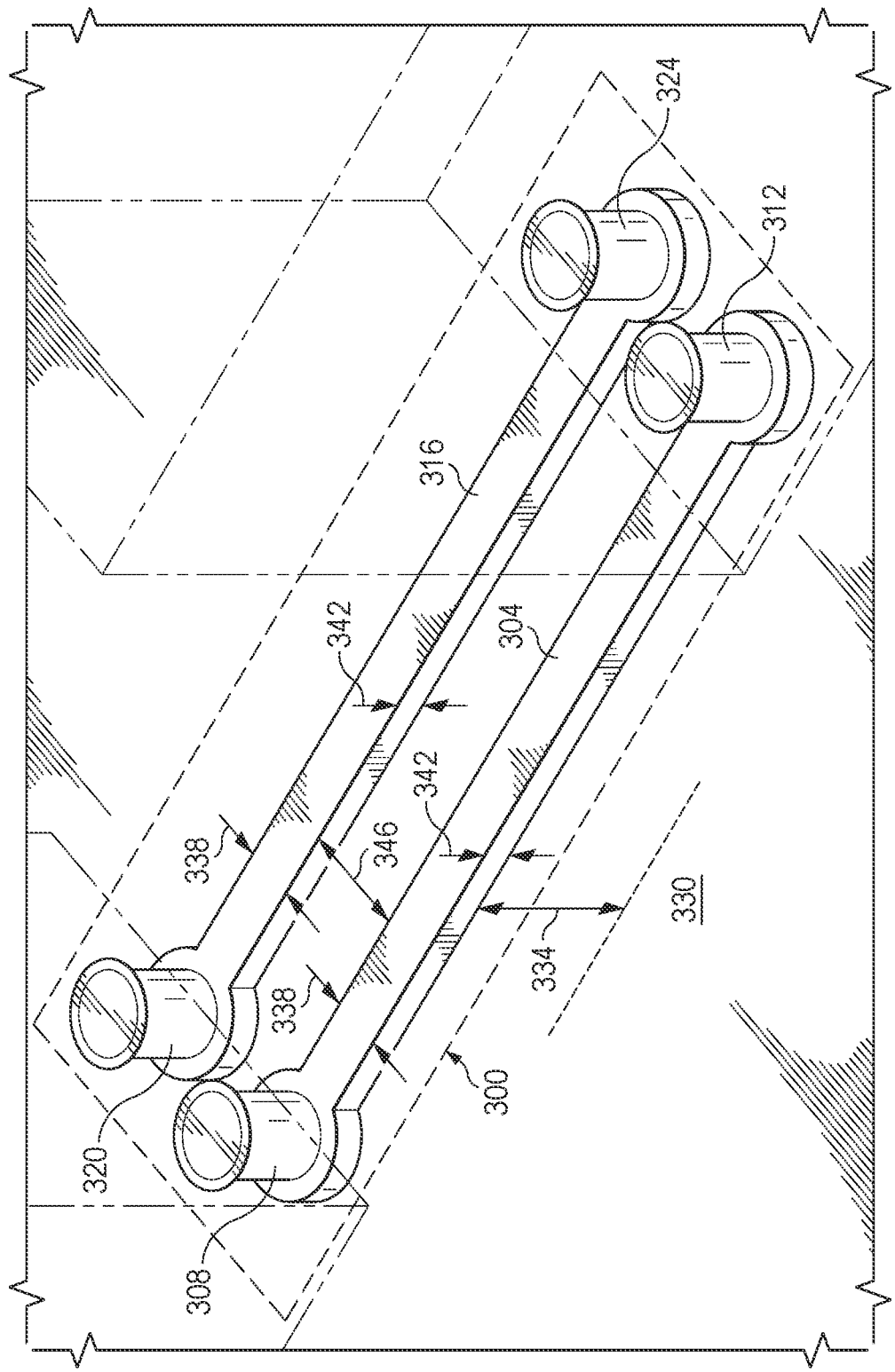
FIG. 3 illustrates an example of a pair of transmission line structures that provide a differential signaling structure.

FIG. 3 illustrates a diagram of a pair of transmission line structures 300 that are alternatively employable to implement a pair of the transmission line structures 124 of FIGS. 1A and 1B. The pair of transmission line structures 300 are fabricated in a multi-layer package substrate, such as the multi-layer package substrate 104 of FIGS. 1A and 1B. The pair of transmission line structures 300 includes a first trace 304 that extends between a first via 308 and a second via 312. The pair of transmission line structures 300 also includes a second trace 316 that extends between a third via 320 and a fourth via 324. The pair of transmission line structures 300 are a differential signaling structure. Stated differently, the first trace 304, the second trace 316, the first via 308, the second via 312, the third via 320 and the fourth via 324 are constituent components of the differential signaling structure. The first via 308 and the third via 320 are coupled to ports of a first die (e.g. the first die 108 of FIGS. 1A and 1B) an the second via 312 and the fourth via 324 are coupled to ports of a second die (e.g., the second die 112 of FIGS. 1A and 1B). In this manner, the pair of transmission line structures 300 provide a portion of a communication channel (e.g., the communication channel 120 of FIG. 1B) between the first die and the second die.

The first trace 304 and the second trace 316 have dimensions that are selected to provide a predetermined characteristic impedance, $Z_0$ of about 100Ω. The first trace 304 and the second trace 316 are parallel and co-planer. The first trace 304 and the second trace 316 overlay a ground plane 330, such as the ground plane 164 of FIGS. 1A and 1B that defines a height 334 of the first trace 304 and the second trace 316. The height 334 is alternatively referred to as a depth of the first trace 304 and the second trace 316. The first trace 304 and the second trace 316 have a width 338 and a thickness 342. The first trace 304 and the second trace 316 have a spacing 346.

In one example, the first trace 304 and the second trace 316 have a spacing of about 75 μm. Also, the first trace 304 and the second trace 316 have a width of about 30 μm and a height (depth) of about 45 μm. Thus, the pair of transmission line structures 300 have a width to height ratio of about 0.66. Accordingly, the height of the first trace 304 and the second trace 316 is about 1.5 times greater than the width of the first trace 304 and the second trace 316. In such an example, the characteristic impedance of the first trace 304 and the second trace 316 is about 100Ω.

Referring back to FIGS. 1A and 1B, as demonstrated in FIGS. 2 and 3 the dimensions of the traces 152 can be selected to provide a predetermined characteristic impedance, $Z_0$. More specifically, in examples where the transmission line structures 124 are single-ended signaling structures, the traces 152 have a characteristic impedance, $Z_0$ of about 50Ω. In examples where the transmission line structures 124 are pairs of differential signaling structures, the traces 152 have a characteristic impedance, $Z_0$ of about 100Ω.

In some examples, additional features are added to the transmission line structures 124 and/or to the ground plane 164 to tune the characteristic impedance, $Z_0$ of the traces 152. More particularly, in some examples, apertures are cut from the ground plane 164 to change the characteristic impedance, $Z_0$ of the traces 152. Additionally or alternatively, in some examples, a width of segments of the traces 152 are reduced to change the characteristic impedance, $Z_0$ of the traces 152.

Figure 4:
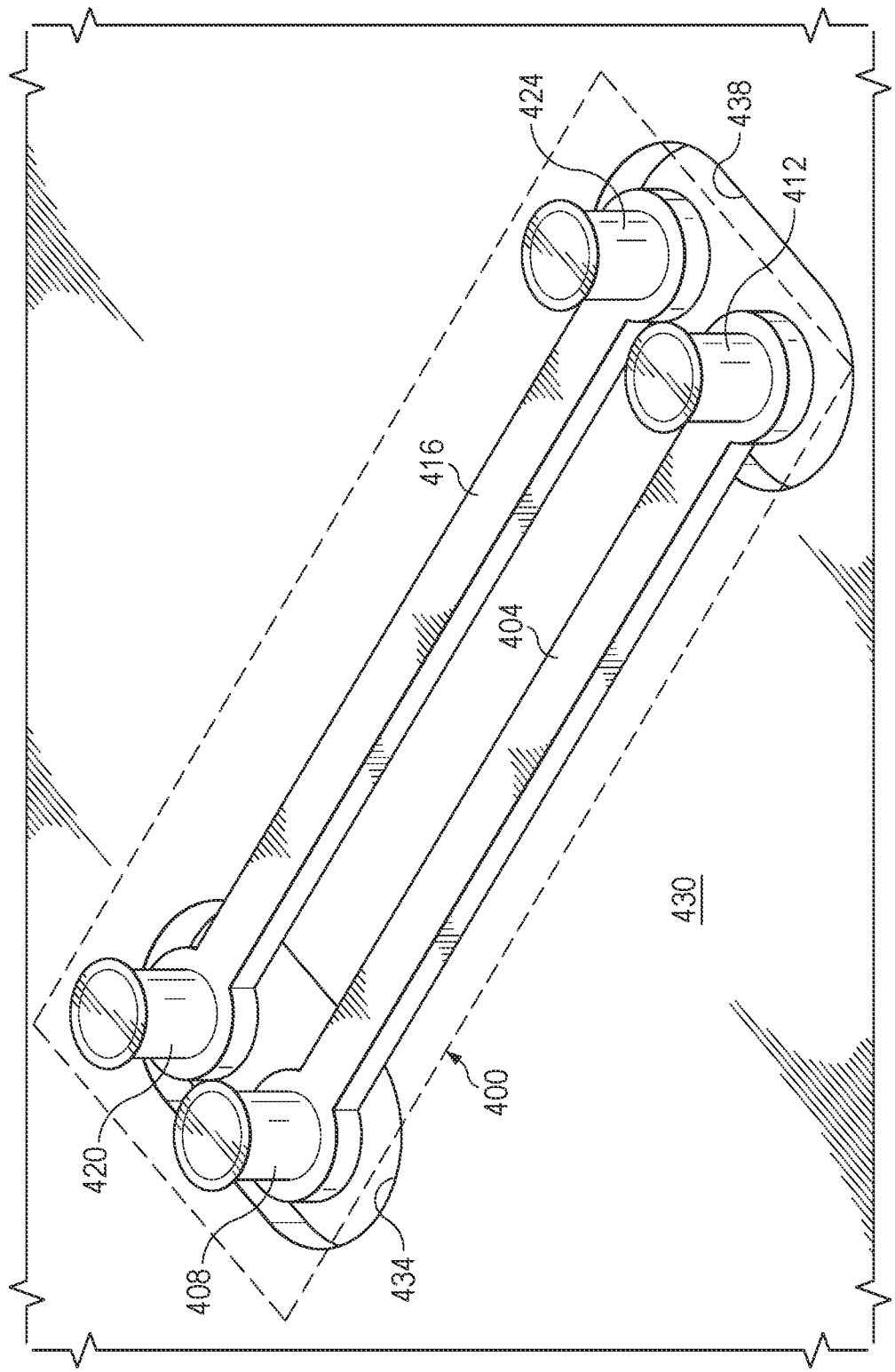
FIG. 4 illustrates a pair of transmission line structures with vias that overlay apertures cut in a ground plane.

FIG. 4 illustrates a diagram of a pair of transmission line structures 400 that are employable to implement a pair the transmission line structures 124 of FIGS. 1A and 1B. The pair of transmission line structures 400 are fabricated in a multilayer package substrate, such as the multi-layer package substrate 104 of FIGS. 1A and 1B. The pair of transmission line structures 400 are a differential signaling structure. The pair of transmission line structures 400 includes a first trace 404 that extends between a first via 408 and a second via 412. The pair of transmission line structures 400 also includes a second trace 416 that extends between a third via 420 and a fourth via 424. The first via 408 and the third via 420 are coupled to ports of a first die (e.g. the first die 108 of FIGS. 1A and 1B) and the second via 412 and the fourth via 424 are coupled to ports of a second die (e.g., the second die 112 of FIGS. 1A and 1B). In this manner, the pair of transmission line structures 400 provides a portion of a communication channel (e.g., the communication channel 120 of FIGS. 1A and 1B) between the first die and the second die.

The first trace 404 and the second trace 416 have dimensions that are selected to provide a predetermined characteristic impedance, $Z_0$ of about 100Ω. The first trace 404 and the second trace 416 are parallel and co-planer. The first trace 404 and the second trace 416 overlay a ground plane 430, such as the ground plane 164 of FIGS. 1A and 1B. The first trace 404 and the second trace 416 have a height, width and separation similar to the pair of transmission line structures 400 of FIG. 3.

Also, the ground plane 430 includes a first aperture 434 that underlies the first via 408 and the third via 420. The ground plane 430 also includes a second aperture 438 that underlies the second via 412 and the fourth via 424. Inclusion of the first aperture 434 and the second aperture 438 reduces a parasitic capacitance caused in part by solder bumps (e.g., the solder bumps 136 of FIGS. 1A and 1B) employed to couple the vias to the ports of the first die and the second die. Inclusion of the first aperture 434 and the second aperture 438 allows for an increase in the characteristic impedance, $Z_O$. Also, although FIG. 4 illustrates the pair of transmission line structures 400, in other examples, the first aperture 434 and the second aperture 438 are employable for a singled-ended signaling structure, such as the transmission line structure 200 of FIG. 2.

Figure 5:
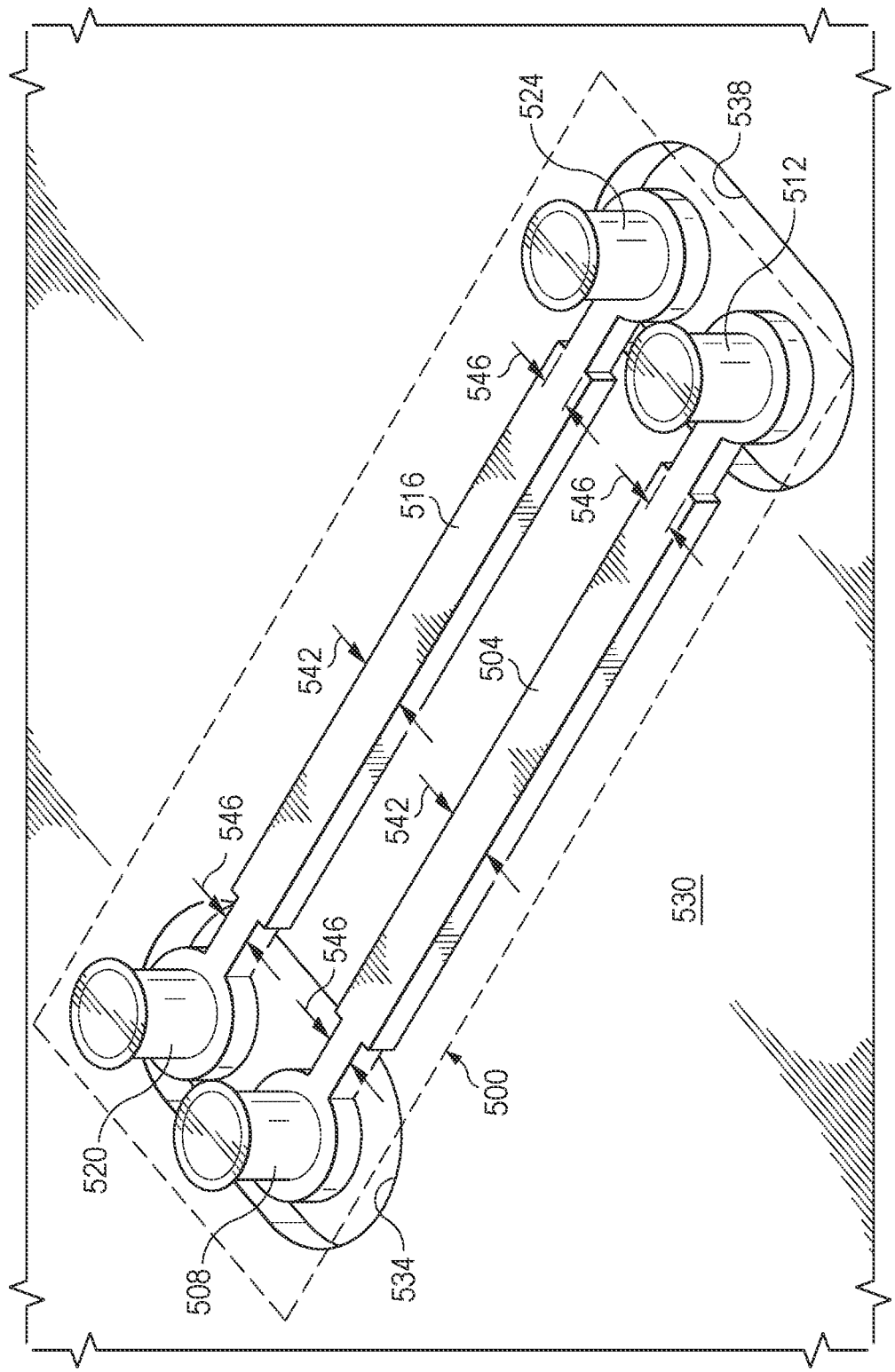
FIG. 5 illustrates a pair of transmission line structures with traces that have a first width an a second width and vias that overlay apertures cut in a ground plane.

FIG. 5 illustrates a diagram of a pair of transmission line structures 500 that are employable to implement a pair the transmission line structures 124 of FIGS. 1A and 1B. The pair of transmission line structures 500 are fabricated in a multilayer package substrate, such as the multi-layer package substrate 104 of FIGS. 1A and 1B. The pair of transmission line structures 500 are a differential signaling structure. The pair of transmission line structures 500 includes a first trace 504 that extends between a first via 508 and a second via 512. The pair of transmission line structures 500 also includes a second trace 516 that extends between a third via 520 and a fourth via 524. The first via 508 and the third via 520 are coupled to ports of a first die (e.g. the first die 108 of FIGS. 1A and 1B) an the second via 512 and the fourth via 524 are coupled to ports of a second die (e.g., the second die 112 of FIGS. 1A and 1B). In this manner, the pair of transmission line structures 500 provides a portion of a communication channel (e.g., the communication channel 120 of FIGS. 1A and 1B) between the first die and the second die.

The first trace 504 and the second trace 516 have dimensions that are selected to provide a predetermined characteristic impedance, $Z_O$ of about 100Ω. The first trace 504 and the second trace 516 are parallel and co-planer. The first trace 504 and the second trace 516 overlay a ground plane 530, such as the ground plane 164 of FIGS. 1A and 1B. Also, the ground plane 530 includes a first aperture 534 that underlies the first via 508 and the third via 520. The ground plane 530 also includes a second aperture 538 that underlies the second via 512 and the fourth via 524, similar to the first aperture 434 and the second aperture 438 of FIG. 4.

Further, the first trace 504 and the second trace 508 have dimensions, such as a height (measured from the ground plane 530), a thickness and a separation. Further, the first trace 504 and the second trace 516 have a first width 542 and a second width 546. The second width 546 is less than the first width 542. The first trace 504 has the second width 546 at tapered segments (e.g., end segments) of the first trace 504 that are proximal to the first via 508 and the second via 512. Similarly, the second trace 516 has the second width 546 at tapered segments (e.g., end segments) of the second trace 516 that are proximal to the third via 520 and the fourth via 524. Also, the first trace 504 and the second trace 516 have a segment (e.g., a middle segment) with the first width 542 that extends between the tapered segments with the second width 546. As one example, the first width 542 is about 30 μm and the second width 546 is about 20 μm.

The segments with the second width 546 increases inductance of the first trace 504 and the second trace 516 to offset capacitive loading, thereby curtailing the impact of excessive capacitance to adjust the characteristic impedance, $Z_O$. Further, as explained with respect to FIG. 4, inclusion of the first aperture 534 and the second aperture 538 reduces a parasitic capacitance caused in part by solder bumps (e.g., the solder bumps 136 of FIGS. 1A and 1B) employed to couple the vias to the ports of the first die and the second die. Thus, inclusion of the first aperture 534 and the second aperture 538 allows for a further increase in the characteristic impedance, $Z_O$. Also, in some examples, the first aperture 534 and the second aperture 538 are omitted. Also, although FIG. 5 illustrates the pair of transmission line structures 500, in other examples, the second width 546 of a trace is employable for a singled-ended signaling structure, such as the transmission line structure 200 of FIG. 2.

Figure 6A:
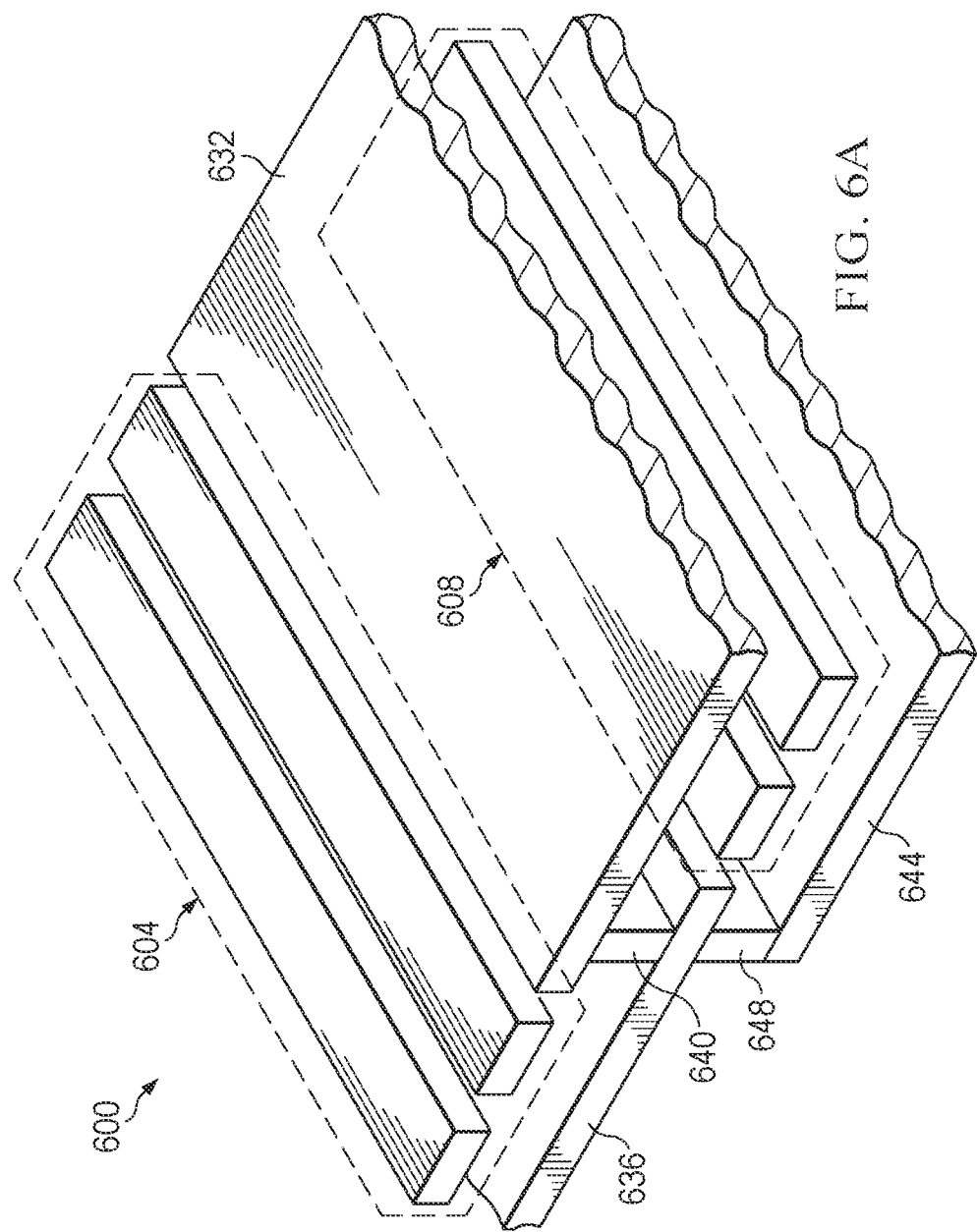
FIG. 6A illustrates an orthogonal view of a portion of a multi-layer substrate package with transmission line structures.
Figure 6B:
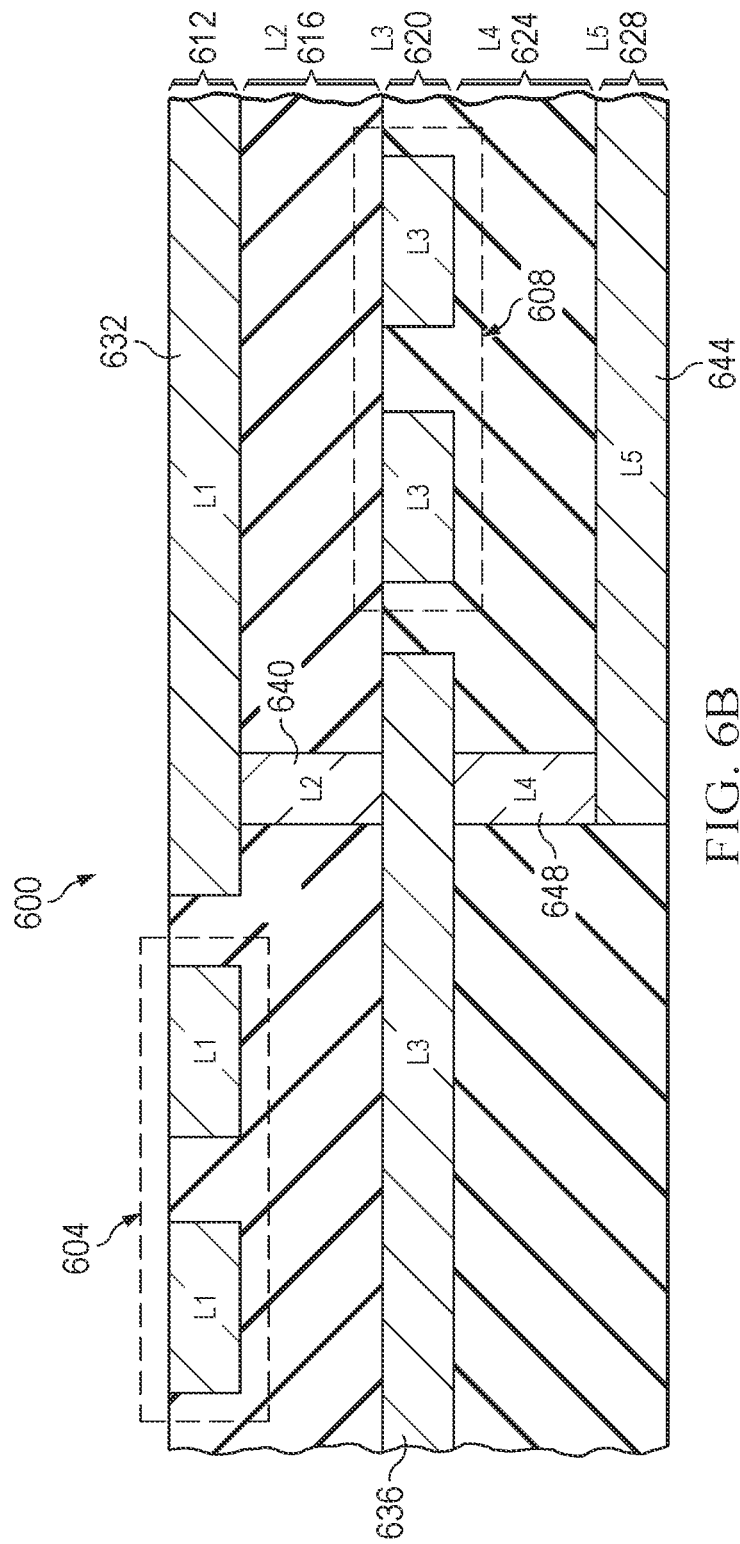
FIG. 6B illustrates a cross-sectional view of the portion of a multi-layer substrate package with transmission line structures.

Referring back to FIGS. 1A and 1B, as demonstrated in FIGS. 2-5, different characteristics for the transmission line structures 124 are selected to tune the characteristic impedance, $Z_O$ of the traces 152. Further, in some examples, a first subset and a second subset of the transmission line structures 124 are situated on different layers of the multi-layer package substrate 104 to curtail channel cross-talk between the transmission line structures 124. Curtailment of this cross-talk increases the bandwidth of the communication channel 120. FIGS. 6A and 6B illustrate this concept.

FIG. 6A illustrates an orthogonal view of a portion of a multi-layer package substrate 600 (e.g., the multi-layer package substrate 104 of FIGS. 1A and 1B) that includes a first pair of transmission line structures 604 and a second pair of transmission line structures 608 on different layers of the multi-layer package substrate 600. FIG. 6B illustrates a cross-sectional diagram of the multi-layer package substrate 600. Thus, FIGS. 6A and 6B employ the same reference numbers to denote the same structures. The first pair of transmission line structures 604 and the second pair of transmission line structures 608 are implemented in a manner similar to the pair of transmission line structures 300 of FIG. 3, the pair of transmission line structures 400 of FIG. 4 and/or the transmission line structures 500 of FIG. 5.

The multi-layer package substrate 600 includes three (3) metal layers separated by two (2) dielectric layers. A first layer 612 (L1) of the multi-layer package substrate 600 is a first metal layer and a second layer 616 (L2) of the multi-layer package substrate 600 is a first dielectric layer. A third layer 620 (L3) of the multi-layer package substrate 600 is a second metal layer and a fourth layer 624 of the multi-layer package substrate 600 is a second dielectric layer. A fifth layer 628 (L5) of the multi-layer package substrate 600 is a third metal layer.

The first pair of transmission line structures 604 are formed on the first layer 612 (L1) of the multi-layer package substrate 600. A ground plane 632 of the first layer 612 of the multi-layer package substrate 600 overlays the second pair of transmission line structures 608. The second pair of transmission line structures 608 are formed on the third layer 620 (L3) of the multi-layer package substrate 600. The third layer 620 of the multi-layer package substrate 600 also includes a ground plane 636 that underlies the first pair of transmission line structures 604. A first ground wall box 640 of the second layer 616 couples the ground plane 632 of the first layer 612 to the ground plane 636 of the third layer 620.

The fifth layer 628 includes a ground plane 644 that underlies the second pair of transmission line structures 608. Also, the ground plane 636 of the third layer 620 is coupled to the ground plane 644 through a second ground wall box 648. The second pair of transmission line structures 608 is sandwiched between the ground plane 632 of the first layer 612 and the ground plane 644 of the fifth layer 628.

As is demonstrated, the ground plane 632 of the first layer 612 and the ground plane 644 of the fifth layer 628 isolates an electric field induced by the second set of transmission line structures 608. In a similar manner, the ground plane 636 of the third layer 620 isolates an electric field induced by the first pair of transmission line structures 604. Thus, cross-talk between the first pair of transmission line structures 604 and the second pair of transmission line structures 608 is curtailed.

Referring back to FIGS. 1A and 1B, as demonstrated, many different configurations are possible for the transmission line structures 124 to form the communication channel 120 between the first die 108 and the second die 112. The communication channel 120 has a direct current (DC) bandwidth of about 32 gigabits per second (Gbps) or more. Also, using a protocol such as pulse amplitude modulation 4-level (PAM4), the communication channel 120 provides a bandwidth of about 112 Gbps or more. Further, implementing the communication channel 120 obviates the need for integrating the circuits of the first die 108 and the second die 112, allowing for improved space efficiency in the semiconductor device 100.

Figure 7:
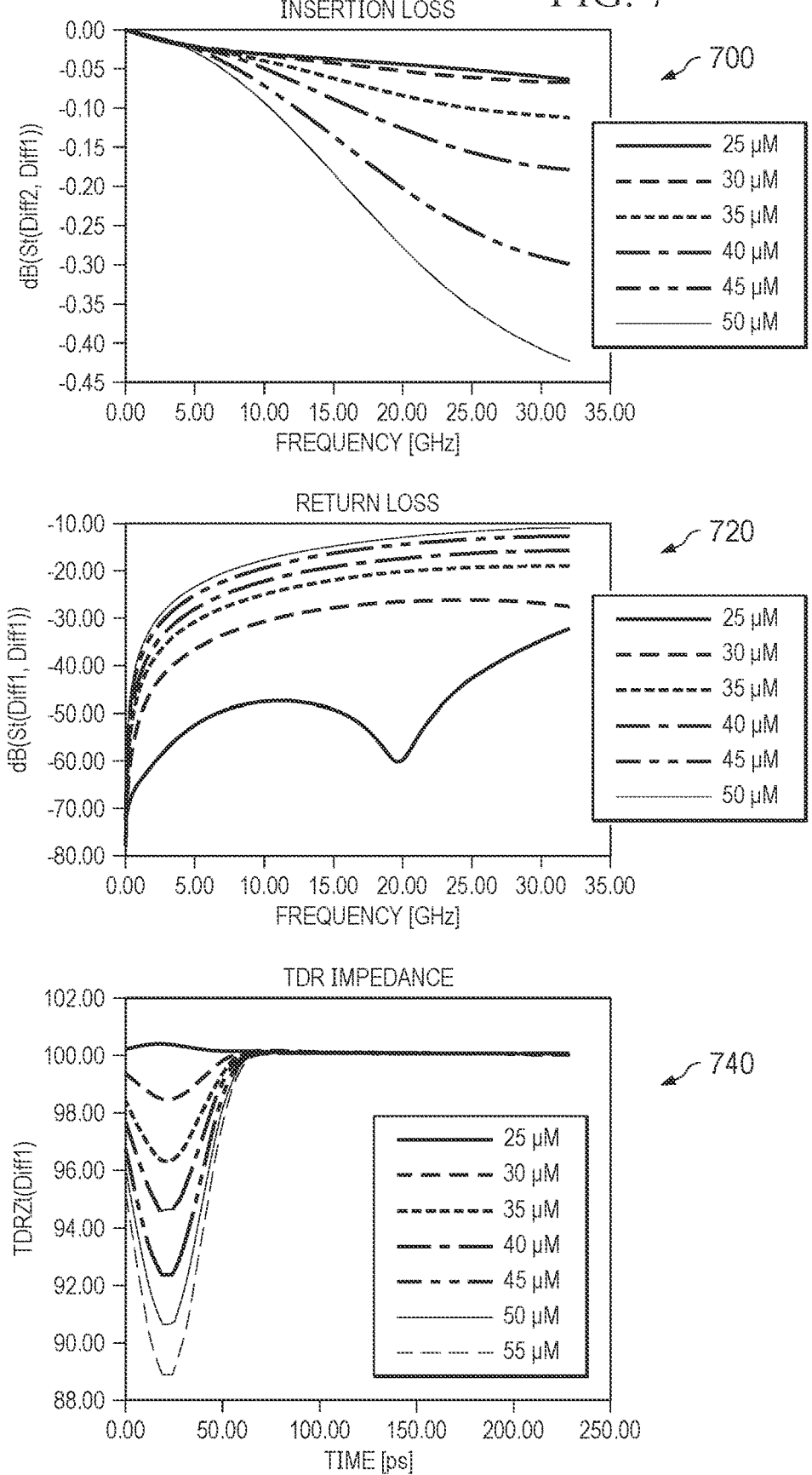
FIG. 7 illustrates graphs representing the operational performance of a semiconductor device, where a communication channel between a first die and a second die is formed of pairs of transmission line structures with different dimensions.

FIG. 7 illustrates graphs representing the operational performance of a semiconductor device (e.g., the semiconductor device 100 of FIGS. 1A and 1B), where a communication channel (e.g., the communication channel 120 of FIG. 1B) is provided between a first die (e.g., the first die 108 of FIGS. 1A and 1B) and a second die (e.g., the second die 112 of FIGS. 1A and 1B). In FIG. 7, it is presumed that the first die is separated from the second die by about 0.5 millimeters (mm). Also, it is presumed that the communication channel is formed with pairs of transmission line structures, with traces such as the transmission line structure 300 of FIG. 3. Also the graphs of FIG. 7 includes plots for different widths of the traces (e.g., the width 338 of FIG. 3). Specifically, the performance characteristics of the traces of the pair of transmission line structures are plotted for widths of 25 µm, 30 µm, 35 µm, 40 µm, 45 µm and 50 µm.

A first graph 700 plots an insertion loss, in decibels (dB) as a function of frequency, in gigahertz (GHz) of the pair of the traces on the transmission line structure. A second graph 720 plots a return loss, in decibels (dB) as a function of frequency, in GHz of the pair of the traces on the transmission line structure. A third graph 740 plots a time domain reflection (TDR) measured impedance in Ohms (Ω) as a function of time, in picoseconds (ps). The third graph 740 includes a plot for a trace width of 55 µm.

As illustrated in the graphs 700 and 720, selection of a trace width of about 25 µm or about 30 µm provides a relatively low insertion loss and return loss. Also, as illustrated in the graph 740, a trace width of about 25 µm or about 30 µm provides a TDR measured impedance (corresponding to a characteristic impedance, $Z_0$) about 100Ω.

Figure 8:
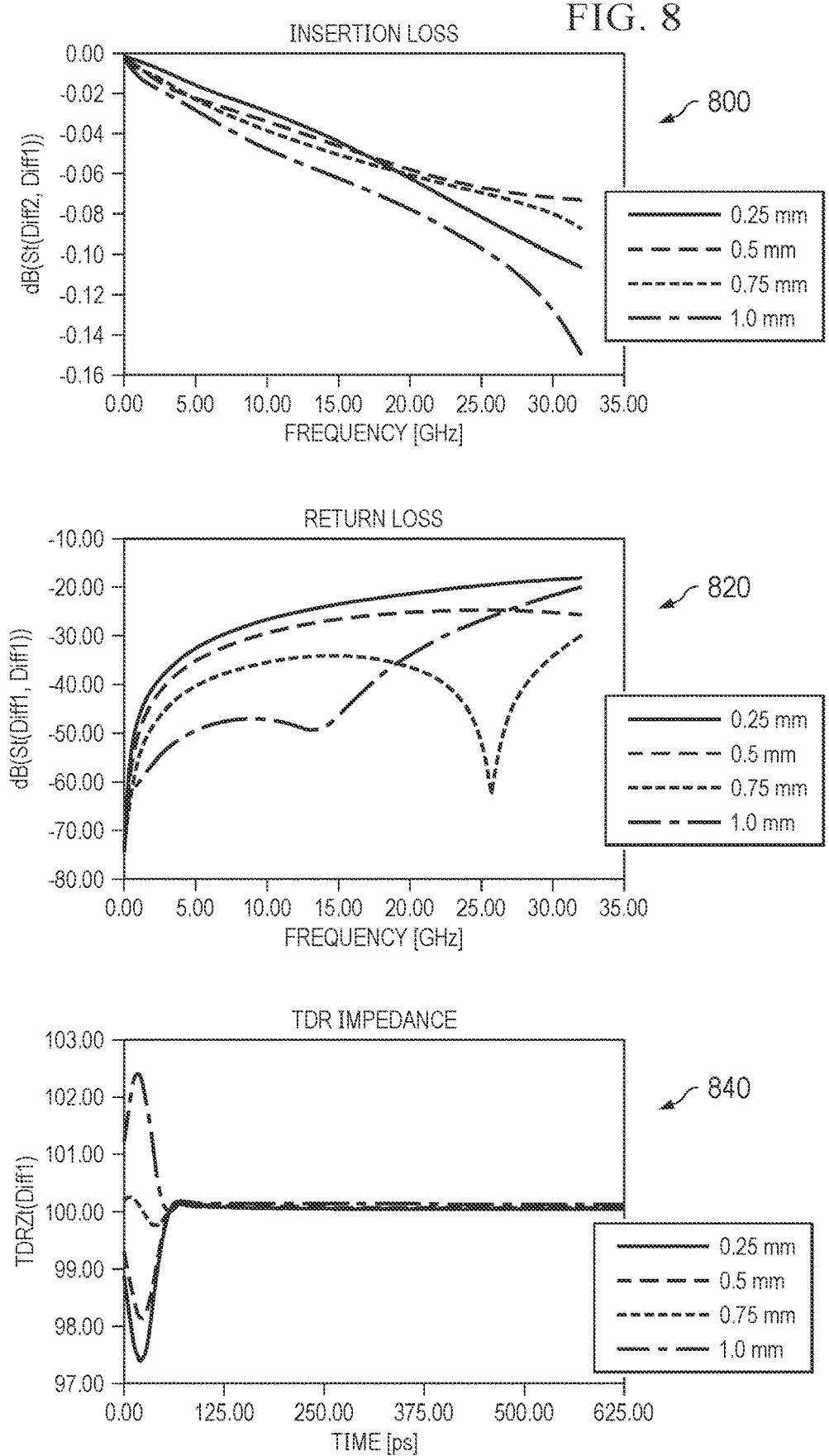
FIG. 8 illustrates graphs representing the operational performance of a semiconductor device, where a communication channel is formed of pairs of transmission line structures that are provided between a first die and a second die for different spacings between the first die and the second die.

FIG. 8 illustrates graphs representing the operational performance of a semiconductor device (e.g., the semiconductor device 100 of FIGS. 1A and 1B), where a communication channel (e.g., the communication channel 120 of FIG. 1B) is provided between a first die (e.g., the first die 108 of FIGS. 1A and 1B) and a second die (e.g., the second die 112 of FIGS. 1A and 1B). It is presumed that the communication channel is formed with pairs of transmission line structures, with traces such as the transmission line structure 300 of FIG. 3. Also, the graphs of FIG. 8 includes plots for different distances between the first die and the second die. Specifically, the performance characteristics of the traces of the pair of transmission line structures are plotted for distances between the first die and the second die of 0.25 mm, 0.50 mm, 0.75 mm and 1 mm.

A first graph 800 plots an insertion loss, in decibels (dB) as a function of frequency, in gigahertz (GHz) of the pair of the traces on the transmission line structure. A second graph 820 plots a return loss, in decibels (dB) as a function of frequency, in GHz of the pair of the traces on the transmission line structure. A third graph 840 plots a TDR measured impedance in Ohms (Ω) as a function of time, in ps.

As illustrated in the graphs 800 and 820, at a frequency up to about 32 GHz, the insertion loss is 0.15 dB or better and the return loss is 15 dB or better for each plotted spacing of the first die and the second die. Also, as illustrated in the third graph 840, TDR measured impedance (corresponding to a characteristic impedance, $Z_0$) is between 97Ω and 103Ω for each plotted spacing of the first die and the second die.

Figure 9:
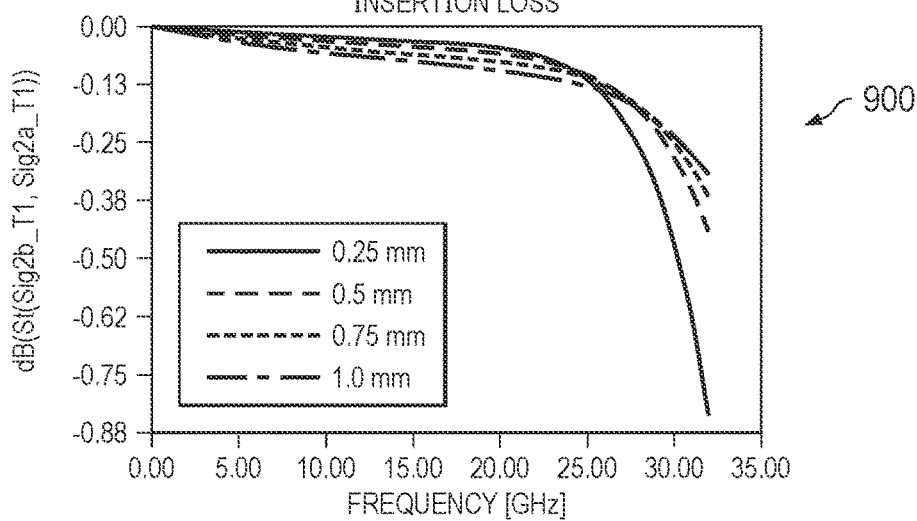
FIG. 9 illustrates graphs representing the operational performance of a semiconductor device, where a communication channel between a first die and a second die is formed of transmission line structures for different spacings between the first die and the second die.
Figure 9:
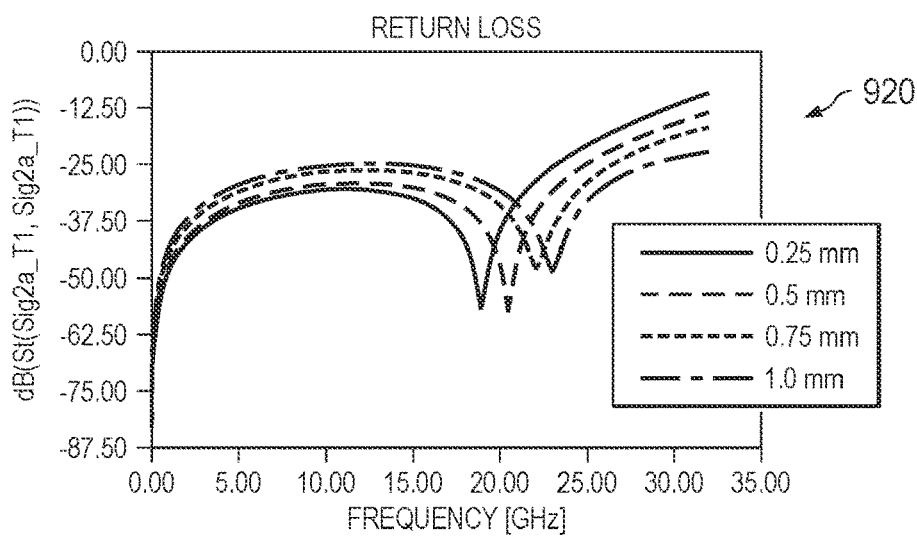
Figure 9:
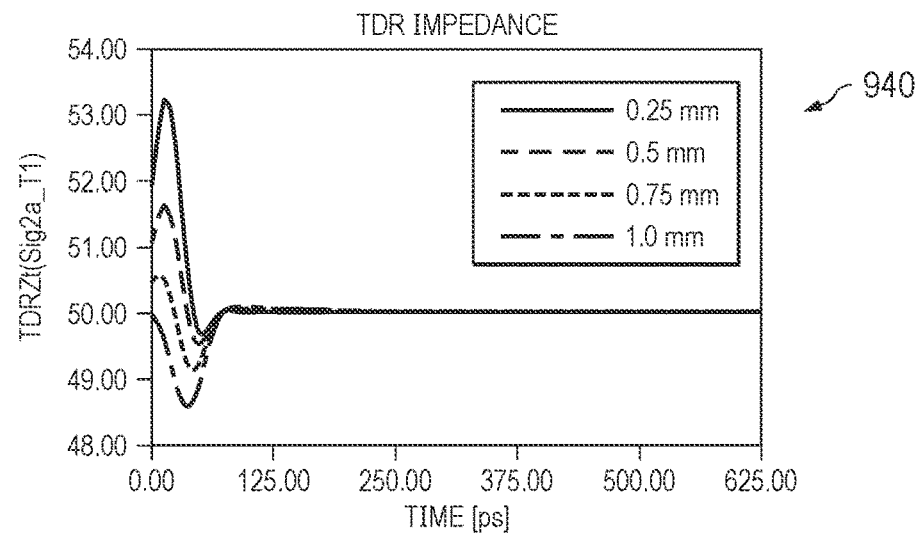

FIG. 9 illustrates graphs representing the operational performance of a semiconductor device (e.g., the semiconductor device 100 of FIGS. 1A and 1B), where a communication channel (e.g., the communication channel 120 of FIG. 1B) is provided between a first die (e.g., the first die 108 of FIGS. 1A and 1B) and a second die (e.g., the second die 112 of FIGS. 1A and 1B). It is presumed that the communication channel is formed with single-ended signaling structures, such as the transmission line structure 200 of FIG. 2. The graphs of FIG. 9 includes plots for different distances between the first die and the second die. Specifically, the performance characteristics of the traces of the pair of transmission line structures are plotted for distances between the first die and the second die of 0.25 mm, 0.50 mm, 0.75 mm and 1 mm.

A first graph 900 plots an insertion loss, in decibels (dB) as a function of frequency, in gigahertz (GHz) of the traces on the transmission line structure. A second graph 920 plots a return loss, in decibels (dB) as a function of frequency, in GHz of the pair of the traces on the transmission line structure. A third graph 940 plots a TDR measured impedance in Ohms (Ω) as a function of time, in ps of the traces on the transmission line structures.

As illustrated in the graphs 900 and 920, at a frequency up to about 27 GHz, the insertion loss is 0.15 dB or better and the return loss is 15 dB or better for each plotted spacing of the first die and the second die. Also, as illustrated in the third graph 940, TDR measured impedance (corresponding to a characteristic impedance, $Z_0$) is between 48Ω and 54Ω for each plotted spacing of the first die and the second die.

Figure 10:
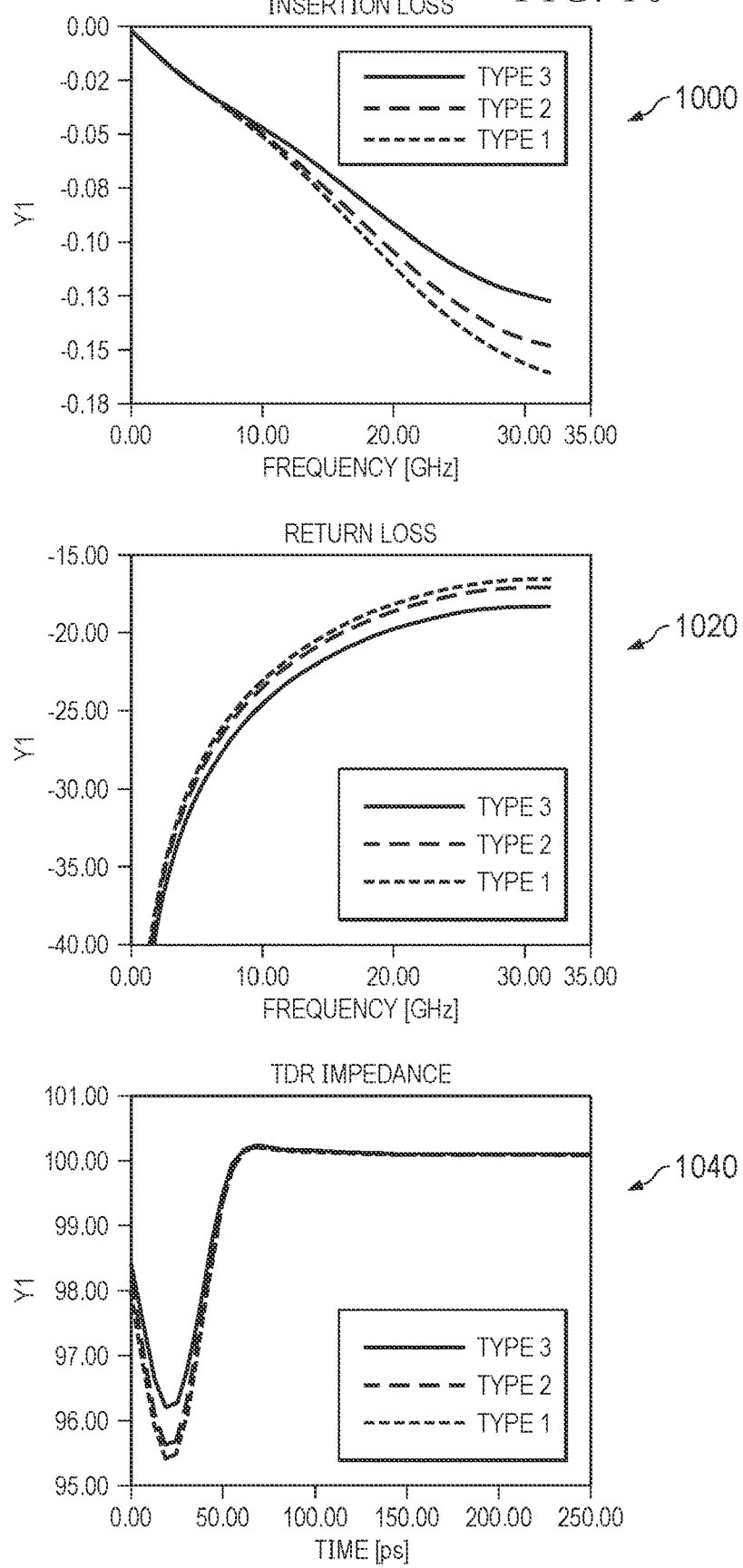
FIG. 10 illustrates graphs representing the operational performance of a semiconductor device, where a communication channel between a first die and a second die is formed of different types of transmission line structures.

FIG. 10 illustrates graphs representing the operational performance of a semiconductor device (e.g., the semiconductor device 100 of FIGS. 1A and 1B), where a communication channel (e.g., the communication channel 120 of FIG. 1B) is provided between a first die (e.g., the first die 108 of FIGS. 1A and 1B) and a second die (e.g., the second die 112 of FIGS. 1A and 1B). It is presumed that the communication channel is formed with differential signaling structures, such as pairs of transmission line structures. The graphs of FIG. 10 includes plots for different types of pairs of transmission line structures. A first type (labeled "TYPE 1" in FIG. 10) includes the pair of transmission line structures 300 of FIG. 3. A second type (labeled "TYPE 2" in FIG. 10) includes the pair of transmission line structures 400 of FIG. 4, wherein vias overlay apertures cut in a ground plane. A third type (labeled "TYPE 3" in FIG. 10) includes the pair of transmission line structures 500 of FIG. 5, wherein the traces include a first width and a second width and vias overlay apertures cut from a ground plane.

A first graph 1000 plots an insertion loss, in decibels (dB) as a function of frequency, in gigahertz (GHz) of the different types of pairs of the traces on the transmission line structure. A second graph 1020 plots a return loss, in decibels (dB) as a function of frequency, in GHz of the different types of pairs of the traces on the transmission line structures. A third graph 1040 plots a TDR measured impedance, $Z_0$ in Ohms (Ω) as a function of time, in ps of the different types of pairs of traces on the transmission line structures.

As illustrated in the graphs 1000 and 1020, inclusion of the apertures cut in the ground plane (employed in the second and third type of pairs of transmission line structures) reduces the insertion loss and the return loss. Also, inclusion of the second width on the traces (employed in the third type of pair of transmission lines structures) further reduces the insertion loss and the return loss. Similarly, as illustrated in the graph 1040, inclusion of the apertures cut in the ground plane (employed in the second and third type of pairs of transmission line structures) increases the TDR measured impedance for a time interval between 0 ps and about 50 ps. Also, inclusion of the second width on the traces (employed in the third type of pair of transmission lines structures) increases TDR measured impedance (corresponding to a characteristic impedance, $Z_0$) for a time interval between 0 ps and about 50 ps.

FIGS. 11-19 illustrate stages of a method for fabricating a multi-layer package substrate, such as the multi-layer package substrate 104 of FIGS. 1A and 1B. The method of FIGS. 11-19 illustrate how multiple layers (four layers illustrated) of material are employable to provide the multi-layer package substrate. However, more layers are added in other examples. Moreover, a similar method can be employed to provide other types of multilayer package substrates.

Figure 11:
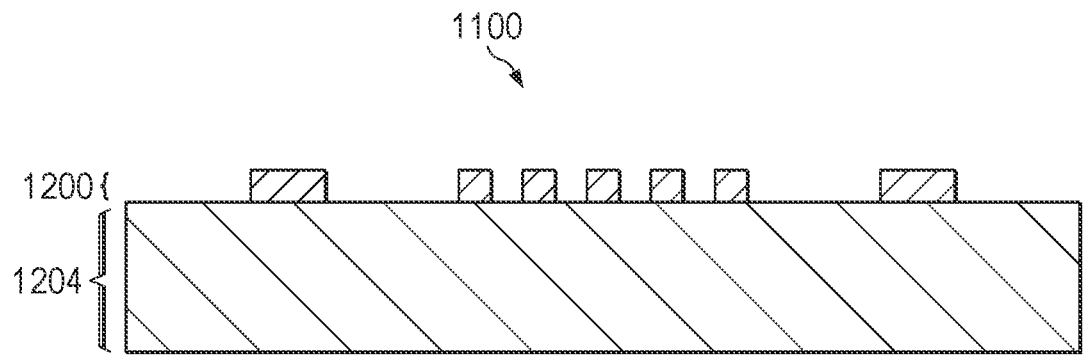
FIG. 11 illustrates a first stage of a method for forming a multi-layer package substrate.
Figure 12:
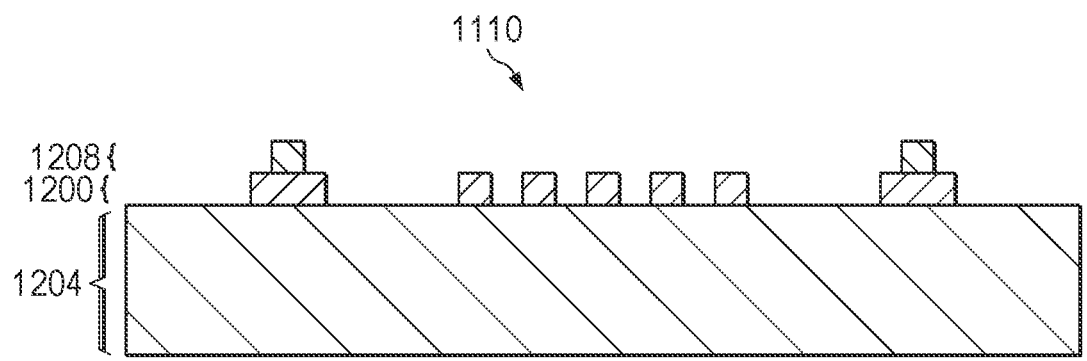
FIG. 12 illustrates a second stage of a method for forming the multi-layer package substrate.
Figure 13:
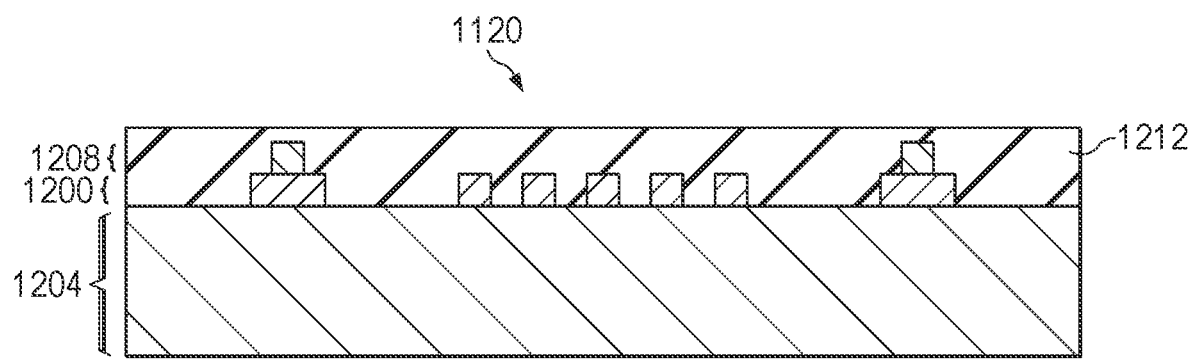
FIG. 13 illustrates a third stage of a method for forming the multi-layer package substrate.
Figure 14:
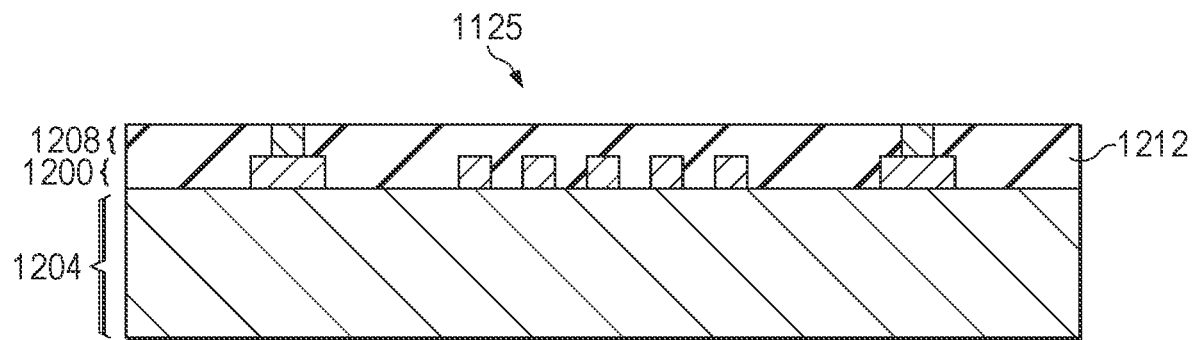
FIG. 14 illustrates a fourth stage of a method for forming the multi-layer package substrate.

As illustrated in FIG. 11, at 1100, in a first stage, a first metal layer pattern 1200 is plated on a metal carrier 1204 to form a first layer of the multi-layer package substrate. As illustrated in FIG. 12, in a second stage, at 1110, pillars 1208 (e.g., copper pillars or pillars formed of other metal) are plated on the first metal layer pattern 1200. As illustrated in FIG. 13, at 1120, in a third stage, a first dielectric layer 1212 is applied in a compressed molding operation to the pillars 1208 and to the first metal layer pattern 1200. As illustrated in FIG. 14, in a fourth stage, at 1125, a portion of the first dielectric layer 1212 is removed in a grinding operation, such that regions of the pillars 1208 are exposed, and a second layer of the multi-layer package substrate is formed.

Figure 15:
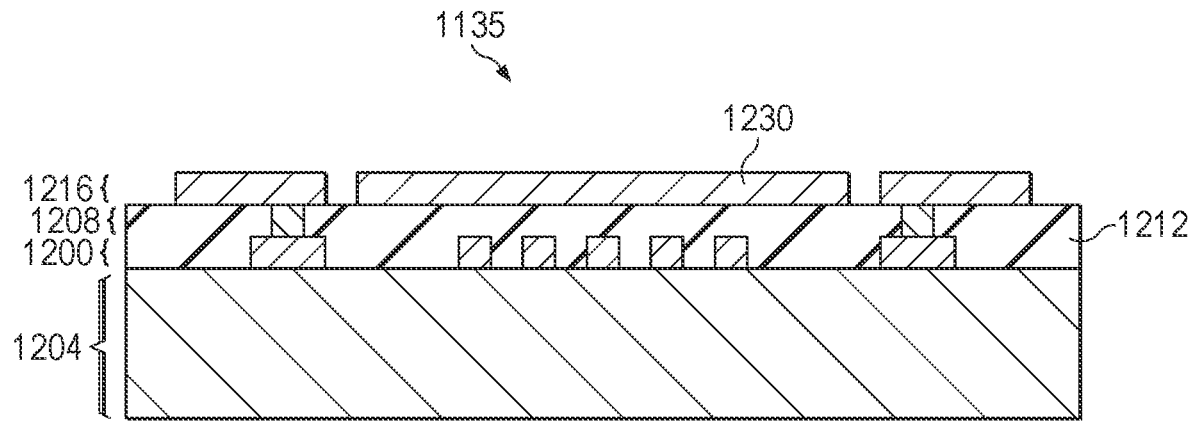
FIG. 15 illustrates a fifth stage of a method for forming the multi-layer package substrate.
Figure 16:
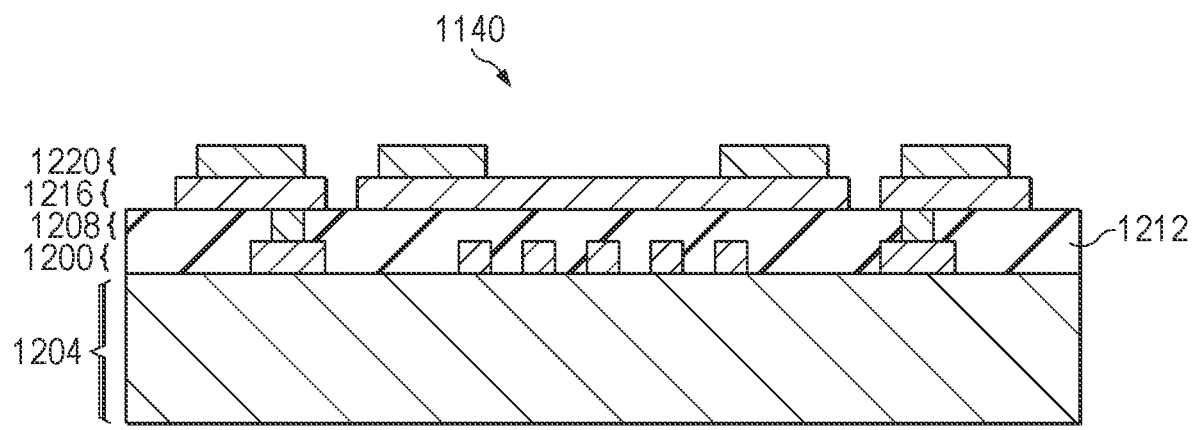
FIG. 16 illustrates a sixth stage of a method for forming the multi-layer package substrate.
Figure 17:
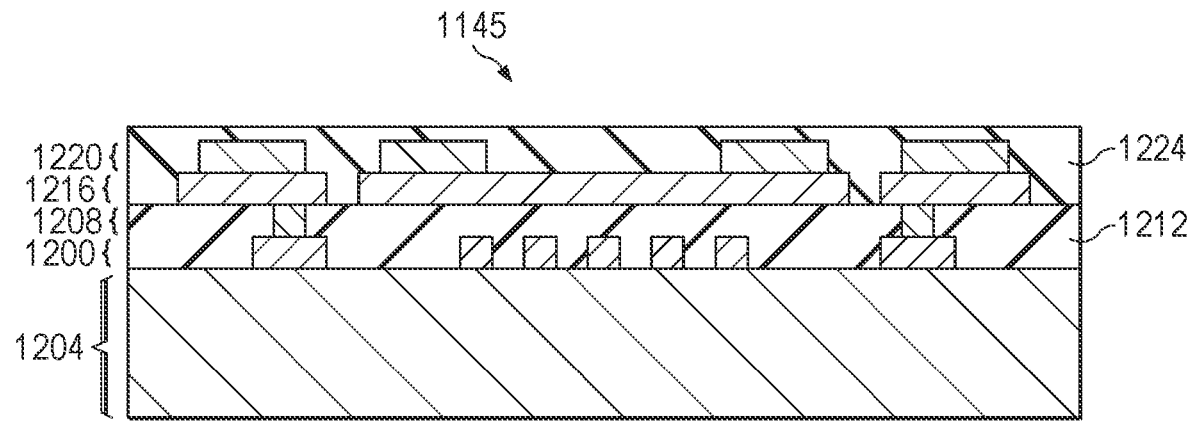
FIG. 17 illustrates a seventh stage of a method for forming the multi-layer package substrate.
Figure 18:
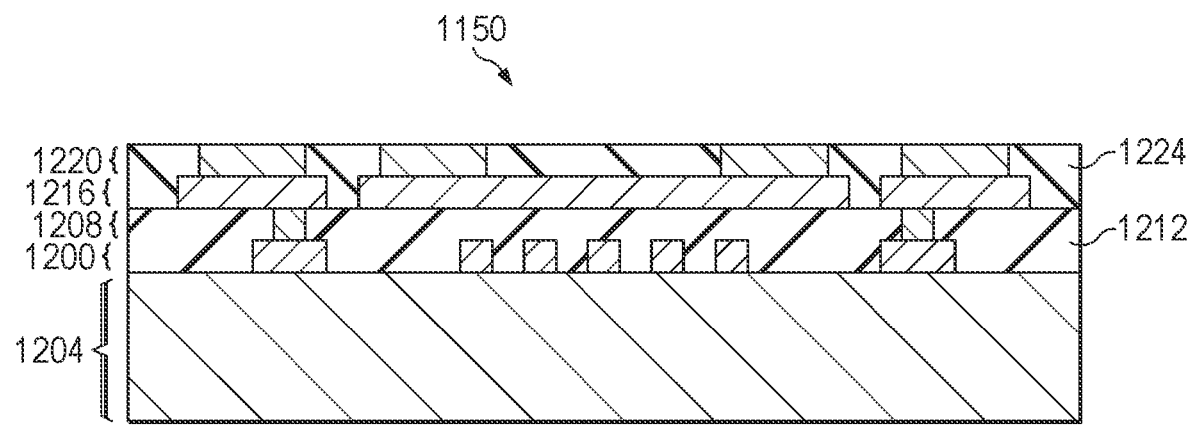
FIG. 18 illustrates an eighth stage of a method for forming the multi-layer package substrate.
Figure 19:
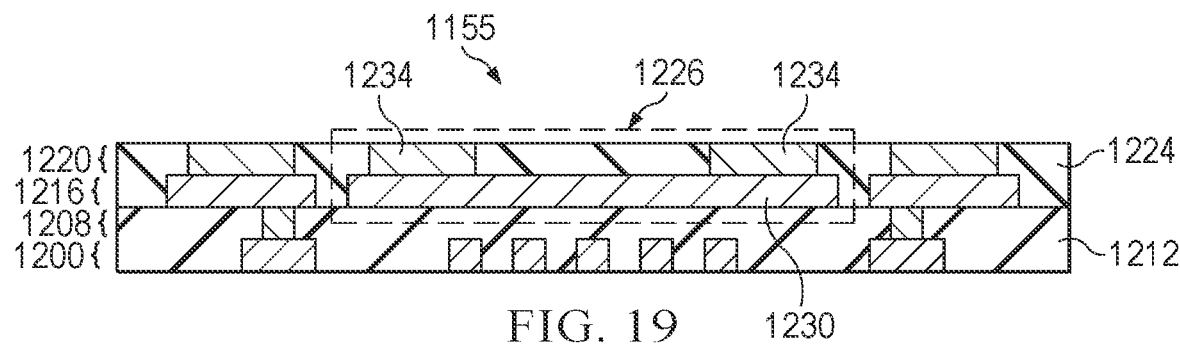
FIG. 19 illustrates a ninth stage of a method for forming the multi-layer package substrate.

As illustrated in FIG. 15, in a fifth stage, at 1135, a second metal layer pattern 1216 is plated on the first dielectric layer 1212 of the second layer of the multi-layer package substrate to form a third layer of the multi-layer package substrate. As illustrated in FIG. 16, in a sixth stage, at 1140 pillars 1220 (e.g., copper pillars or pillars formed of other metal) are applied to the second metal layer pattern 1216. As illustrated in FIG. 17, in a seventh stage, at 1145 a second dielectric layer 1224 is applied in a compressed molding operation to the pillars 1220 and to the second metal layer pattern 1216. As illustrated in FIG. 18, in an eight stage, at 1150, a portion of the second dielectric layer 1224 is removed in a grinding operation, such that regions of the pillars 1220 are exposed, and a fourth layer of the multi-layer package substrate is formed. As illustrated in FIG. 19, in a ninth stage, at 1155, the metal carrier 1204 is removed in a de-carrier operation. The de-carrier operation executed at 1130 exposes a region of the first metal layer pattern 1200.

As illustrated in FIGS. 11-19, by implementing the method, the resultant four layers of the multi-layer package substrate are employable to provide relatively complex electrical paths. In particular, as illustrated in FIGS. 11-19, the first dielectric layer 1212 and the second dielectric layer 1224 are formed (pre-molded) prior to mounting a die on the multi-layer package substrate. Such a pre-molding operation distributes dielectric throughout the multi-layer package substrate and enables the complexities of signal paths described herein. For instance, in one example, a first portion of the first metal layer pattern 1200 and the second metal layer pattern 1216 are employable to form a transmission line structure 1226 that includes a trace 1230, such as one of the traces 152 of FIGS. 1A and 1B extending between vias 1234, such as the vias 144 of FIGS. 1A and 1B that enables communication between dies (e.g., the first die 108 and the second die 112 of FIGS. 1A and 1B). The trace 1230 extends in an interior layer of the multi-layer substrate package (namely the second metal layer pattern 1216). The trace 1230 has specific dimensions to provide a predetermine characteristic impedance, $Z_0$. In some examples, the transmission line structure 1226 is a single-ended signaling structure with a characteristic impedance, $Z_0$ of about 50Ω. In other examples, the transmission line structure 1226 is paired with another transmission line structure (hidden from view) to provide a differential signaling structure with a characteristic impedance, $Z_0$ of about 100Ω. Further, the method illustrated in FIGS. 11-19 enables features such as apertures in a ground plane (e.g., the first aperture 434 and the second aperture 438 of FIG. 4) to be formed to tune the characteristic impedance of the transmission line structure 1226.

Figure 20:
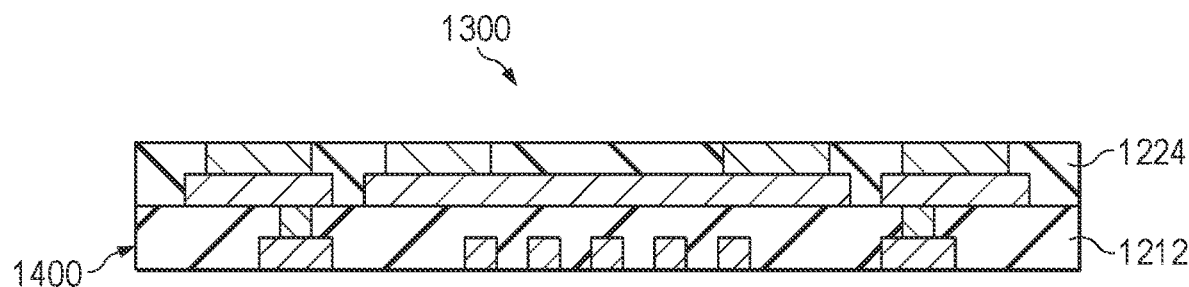
FIG. 20 illustrates a first stage of packaging to form a semiconductor device.
Figure 21:
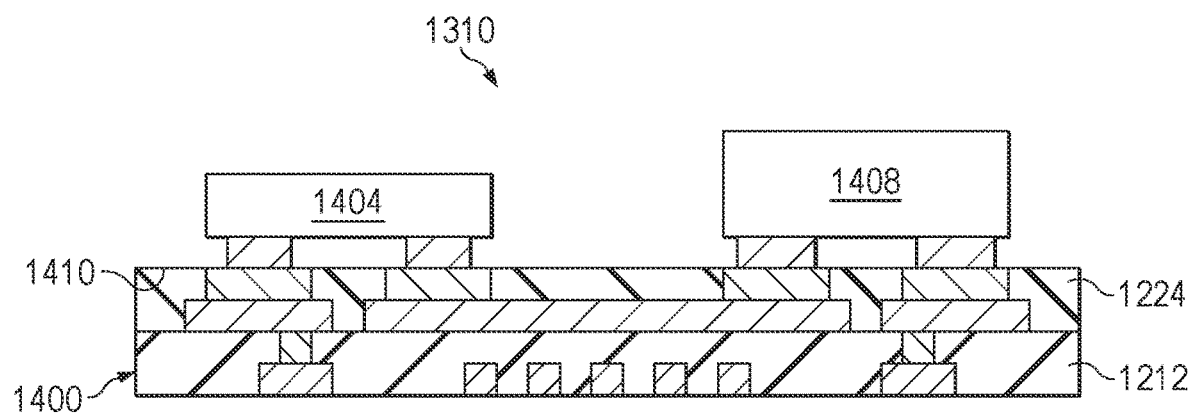
FIG. 21 illustrates a second stage of packaging to form the semiconductor device.
Figure 22:
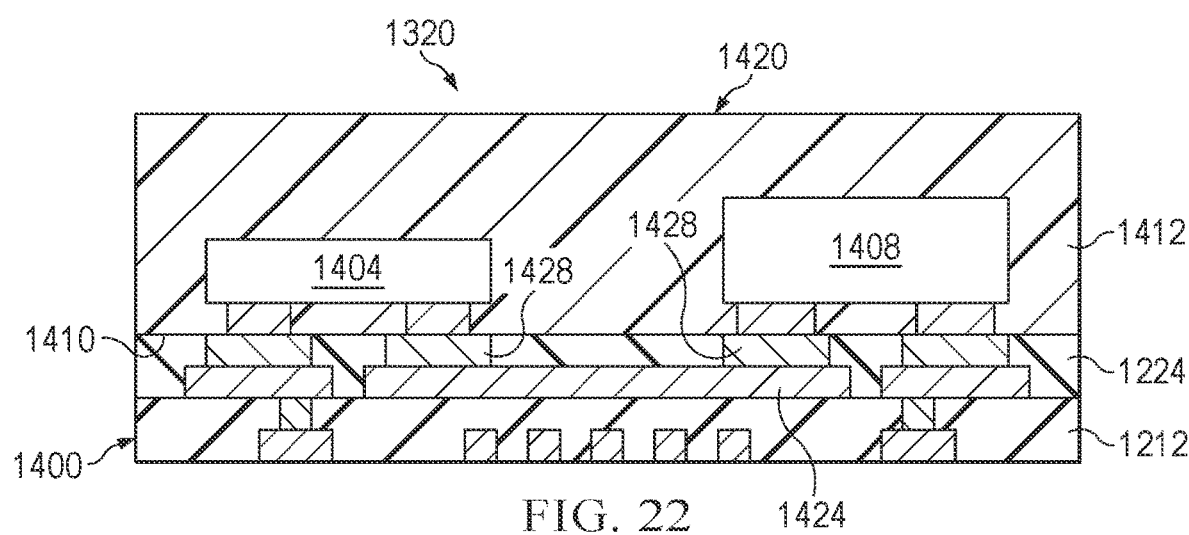
FIG. 22 illustrates a third stage of packaging to form the semiconductor device.

FIGS. 20-22 illustrate stages of a method for packaging a semiconductor device (e.g., an IC chip). The semiconductor device formed by the method of FIGS. 20-22 is employable to implement the semiconductor device 100 of FIGS. 1A and 1B. As illustrated in FIG. 20, in a first stage, at 1300, a multi-layer package substrate 1400 is provided. As one example, the multi-layer package substrate 1400 is formed with the method illustrated in FIGS. 11-19. As illustrated in FIG. 21, in a second stage, at 1310 a first die 1404 and a second die 1408 are mounted on (adhered to) a surface 1410 of the multi-layer package substrate 1400 in a soldering operation. The first die 1404 communicates with the second die 1408 through transmission line structures with traces that extend in an interior region of the multi-layer package substrate 1400. In some examples, the first die 1404 includes analog circuit modules and the second die 1408 includes digital circuit modules. As illustrated in FIG. 22, in a third stage, at 1320, a molding 1412 is applied to the first die 1404, the second die 1408 and the multi-layer package substrate 1400 in a packaging operation to form the semiconductor device 1420.

As demonstrated in FIGS. 20-22, in the method illustrated, the multi-layer package substrate 1400 is pre-molded with dielectric for the first die 1404 and the second die 1408. Also, the multi-layer package substrate 1400 includes traces to enable a communication channel (e.g., the communication channel 120 of FIG. 1B) between the first die 1404 and the second die 1408. Accordingly, the dielectric is distributed throughout the multi-layer package substrate 1400, and traces, such as a trace 1424 of the multi-layer package substrate 1400 has a predetermined characteristic impedance, $Z_0$ to enable communication between the first die 1404 and the second die 1408. More specifically, the trace 1424 extends within an interior of the multi-layer package substrate 1400 and extends between vias 1428 of the multi-layer package substrate. The trace 1424 and the vias 1428 form a transmission line structure (e.g., such as the transmission line structures 124 of FIGS. 1A and 1B) that are configured to establish a portion of a communication channel (e.g., the communication channel 120 of FIG. 1B) between the first die 1404 and the second die 1408.

Figure 23:
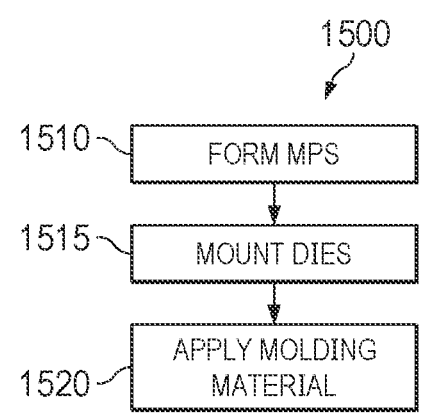
FIG. 23 illustrates a flowchart of an example method for forming a semiconductor device.

FIG. 23 illustrates a flowchart of an example method 1500 for forming a semiconductor device (e.g., an IC package). The method 1500 could be employed for example, to form the semiconductor device 100 of FIGS. 1A and 1B. At 1510, a multi-layer package substrate (e.g., the multi-layer package substrate 104 of FIGS. 1A and 1B) is formed. The multi-layer package substrate is formed, for example, with the method illustrated in FIGS. 11-19. The multi-layer substrate has layers that includes dielectric distributed throughout the multi-layer package substrate. These layers form transmission line structures that overlay a ground plane. Moreover, the transmission line structures include traces extending between vias of the multi-layer package substrate. These traces also extend through an interior layer of the multi-layer substrate, and have a predetermined characteristic impedance.

At 1515, a first die and a second die are mounted on a surface of the multi-layer package substrate. The transmission line structures couple ports of the first die to ports of the second die. At 1520, molding material is applied to the first die, the second die and the multi-layer package substrate to form the semiconductor device.

Modifications are possible in the described embodiments, and other embodiments are possible, within the scope of the claims.

What is claimed is:

1. A semiconductor device comprising:
a first die comprising ports;
a second die comprising ports; and
a multi-layer package substrate comprising:
  a first layer patterned to include pads for the ports of the first die and the second die;
  a second layer patterned to provide vias between the pads for the ports of the first die and pads for the ports of the second die and a third layer of the multi-layer package substrate;
  the third layer being patterned to provide traces that couple the vias coupled to ports of the first die to vias coupled to ports of the second die to couple the first die to the second die, the traces of the third layer of the multi-layer package substrate having a width;
  a fourth layer underlying the third layer; and
  a ground plane underlying the fourth layer, wherein a distance between traces of the third layer and the ground plane defines a height of the traces, and the width and the height of the traces are selected to provide a predetermined characteristic impedance across the traces.

2. The semiconductor device of claim 1, wherein the width of the traces are about 1.77 times greater than the height of the traces.

3. The semiconductor device of claim 2, wherein the predetermined characteristic impedance of the traces is about 50 ohms.

4. The semiconductor device of claim 3, wherein the width of the traces is about 80 micrometers and the height of the traces is about 45 micrometers.

5. The semiconductor device of claim 1, wherein the height of the traces are about 1.5 times greater than the width of the traces.

6. The semiconductor device of claim 5, wherein the predetermined characteristic impedance of the traces is about 100 ohms.

7. The semiconductor device of claim 6, wherein the width of the traces is about 30 micrometers and the height of the traces is about 45 micrometers.

8. The semiconductor device of claim 7, wherein a first trace of the traces and a second trace of the traces are separated by about 75 micrometers.

9. The semiconductor device of claim 8, wherein a first trace of the traces and a second trace of the traces are components of a differential signaling structure.

10. The semiconductor device of claim 1, wherein the traces and vias are configured to establish a communication channel between the first die and the second die that has a bandwidth of at least about 32 gigabits per second.

11. The semiconductor device of claim 10, wherein the communication channel has an insertion loss of about 0.15 decibels or less and a return loss of 15 decibels or less.

12. The semiconductor device of claim 1, wherein the ground plane is cut to provide apertures that underlie the vias coupled to the traces.

13. The semiconductor device of claim 12, wherein the width is a first width of the traces, and the traces have tapered segments with a second width that is less than the first width, wherein the tapered segments are proximal to the vias.

14. The semiconductor device of claim 1, wherein the ground plane is a first ground plane, and the vias are a first set of vias, further wherein:
the second layer being patterned to provide a second set of vias between the pads for the ports of the first die and pads for the ports of the second die and a fifth layer of the multi-layer package substrate;
the fifth layer being patterned to provide traces that couple the vias of the second set of vias coupled to ports of the first die to vias of the second set of vias coupled to ports of the second die to couple the first die to the second die; and
the multi-layer package substrate further comprises a ground plane underlying the fifth layer, wherein a distance between traces of the fifth layer and the ground plane defines a height of the traces of the fifth layer, wherein the width and the height of the traces of the fifth layer are selected to provide a predetermined characteristic impedance across the traces of the fifth layer.

* * * * *